US007977821B2

(12) United States Patent
Kojori et al.

(10) Patent No.: US 7,977,821 B2
(45) Date of Patent: Jul. 12, 2011

(54) HIGH POWER DENSITY SWITCH MODULE WITH IMPROVED THERMAL MANAGEMENT AND PACKAGING

(75) Inventors: Hassan Ali Kojori, Mississauga (CA); Don A. Tegart, Mississauga (CA)

(73) Assignee: Honeywell International Inc., Morristown, NJ (US)

( * ) Notice: Subject to any disclaimer, the term of this patent is extended or adjusted under 35 U.S.C. 154(b) by 400 days.

(21) Appl. No.: 12/117,514

(22) Filed: May 8, 2008

(65) Prior Publication Data
US 2008/0277687 A1 Nov. 13, 2008

Related U.S. Application Data

(60) Provisional application No. 60/917,287, filed on May 10, 2007, provisional application No. 60/917,289, filed on May 10, 2007.

(51) Int. Cl.
*H02J 4/00* (2006.01)
(52) U.S. Cl. ......... 307/112; 307/115; 307/147; 307/149
(58) Field of Classification Search .................. 307/112, 307/113, 115, 147, 149, 154; 200/51.04, 200/51.14–51.17; 361/712, 717, 718
See application file for complete search history.

(56) References Cited

U.S. PATENT DOCUMENTS

| 3,638,073 A * | 1/1972 | Bernstein ..................... 361/712 |
| 4,489,372 A | 12/1984 | Hatano et al. |
| 4,572,947 A | 2/1986 | Kao et al. |
| 4,583,005 A * | 4/1986 | Bevans ......................... 307/115 |
| 4,675,785 A * | 6/1987 | Young ........................... 361/717 |
| 4,779,126 A | 10/1988 | Herman |
| 5,354,981 A | 10/1994 | Dyck |
| 5,512,790 A * | 4/1996 | Lachenmaier et al. ....... 307/112 |
| 5,751,061 A * | 5/1998 | Mays et al. ................... 257/707 |
| 6,021,045 A * | 2/2000 | Johnson ........................ 361/704 |
| 6,037,613 A | 3/2000 | Mariyama |
| 6,038,156 A * | 3/2000 | Inam et al. .................... 363/133 |
| 6,975,023 B2 * | 12/2005 | Oliver et al. ................. 257/676 |
| 6,980,263 B2 | 12/2005 | Hara et al. |
| 7,135,359 B2 | 11/2006 | Agarwal et al. |
| 7,619,325 B1 * | 11/2009 | Hennessy et al. ............. 307/147 |
| 2004/0207968 A1 | 10/2004 | Martin et al. |

OTHER PUBLICATIONS

Mazumder S.K., et al., "Wireless Control of Spatially Distributed Power Electronics", IEEE, Jan. 2005.
Mazumder, S.K., et al., "Wireless PWM Control of a Parallel DC-DC Buck Converter", IEEE Transactions on Power Electronics, vol. 20, No. 6, Nov. 2005.

(Continued)

*Primary Examiner* — Fritz M Fleming
(74) *Attorney, Agent, or Firm* — Miriam Jackson, Esq.

(57) ABSTRACT

A semiconductor power device, e.g., an Insulated Gate Bipolar Transistor (IGBT) or a Metal-Oxide Field Effect Transistor (MOSFET) may be constructed in a reusable and repairable cost-effective sealed shell. The switch may be provided with direct-pressure-contact caps which may perform as electrical conductors for a semiconductor die of the switch and also as thermal heat-sink contacts for the device. The switch may be provided with internal self-powered gate driving control and PHM incorporated in sealed shell. Embodiments of the switch may be constructed with no external gating/PHM connection pin penetrations through the shell.

10 Claims, 11 Drawing Sheets

OTHER PUBLICATIONS

Tahir, M., "Markov Chain Model for Performance Analysis of Transmitter Power Control in Wireless MAC Protocol : Towards Delay Minimization in Power-network Control", 21st International Conference on Advanced Networking and Applications, May 2007.

Tahir, M., "Improving Throughput-delay Performance by Merged Packet Routing in Wirelessly Controlled Interactive Power Networks", 21st International Conference on Advanced Networking and Applications, May 2007.

* cited by examiner

HIGH POWER DENSITY SWITCH MODULE WITH IMPROVED THERMAL MANAGEMENT AND PACKAGING

CROSS-REFERENCE TO RELATED APPLICATIONS

This application claims the benefit of U.S. Provisional Application No. 60/917,287 filed May 10, 2007 and U.S. Provisional Application No. 60/917,289 filed May 10, 2007, the disclosures of which are herein incorporated by reference.

BACKGROUND OF THE INVENTION

The present invention is in the field of solid-state switching devices and, more particularly, packaging and thermal management of solid-state switches.

In some applications, a solid-state switch (e.g., an insulated gate bipolar transistor (IGBT) or a metal-oxide field-effect transistor (MOSFET)) may perform high frequency switching at high power levels. As a consequence, the switch may produce heat. Multiple switches may be assembled in series or in parallel combinations in order to service some high voltage and/or high power applications such as motor control systems. In this context it may be necessary to provide cooling systems for the switches.

Various cooling and heat-sinking systems for switches have been employed in the prior art. A typical prior-art cooling system may employ electrically non-conductive heat transfer elements in contact with electrodes of a semiconductor die or switch (e.g. a MOSFET or IGBT). The heat transfer elements may convey heat into a solid or fluid-filled heat sink. See for example, U.S. Patent Application 2004/0207968. In such prior-art arrangements, heat generated within the die must be conducted through the electrically non-conductive heat transfer element before the heat may be removed from the switch. Consequently, undesirable thermal gradients may develop within the die.

Some prior-art high-power solid-state devices or switches are assembled by soldering multiple semiconductor dice to a substrate and then using wire bonds to electrically connect emitters, collectors and gates of the dice together in parallel/series arrangement to obtain a device with higher current or higher voltage blocking capability. The substrate may be electrically isolated and placed on a heatsink. In high power/high-frequency applications, connection points for these wire-bonds may be a source of undesirable stray inductance, voltage drop, power dissipation and variation in propagation delays (to power and/or control signals) due to presence of different paths with varying lengths dictated by layout geometry.

In such prior art assemblies, reliability may be compromised because of disconnection of bond wires due to corrosion of wires, bond lift-offs, heel cracks, and reconstruction of Al-metallization on the chips are identified as significant limiting factors for device reliability (see for example, "Selected failure mechanisms of modern power modules" by Mauro Ciappa, Microelectronics Reliability 42 (2002) 653-667).

Additionally, in these prior-art assemblies only one-side is typically available and used for cooling of the two-sided dice. This is because one of the two sides is used for internal wire-bond connection of dice. In this regard, an equivalent thermal-resistance from junction to base-plate may be undesirably large due to the existence of a stack-up of multiple-layers of different materials including but not limited to base-plate, direct copper bonded ceramic substrate, the semiconductor die itself, metallization layers and various attachment materials such as solder and/or glue). This large equivalent thermal resistance may dictate de-rating of the device current significantly and higher thermal management may also be required which in turn may drive-up the overall cost, weight, volume of a power conditioning system in which the devices may be employed.

Presence of high thermal gradients within prior-art packaged solid-state switches may diminish reliability of the switches. One particular failure mechanism may occur when the switches are employed in applications with varying atmospheric pressures such as in airborne applications. In these cases, moisture may enter a switch package at entrance points for connection pins (power and/or gating/PHM). Various attempts have been made to provide sealed packages with special sealing around the connection pins to prevent moisture intrusion resulting from altitude changes. So-called "press pack" assemblies may be examples of such prior-art devices. These prior-art sealed packages are expensive and difficult to produce.

As can be seen, there is a need to provide cost-effective and easy-to-manufacture thermal management and packaging systems to overcome these problems. In particular, there is a need to provide such switches in a configuration that may be effectively cooled. Additionally there is a need to provide such switches in a package that may reliably prevent moisture intrusion.

SUMMARY OF THE INVENTION

In one aspect of the present invention an apparatus for switching electrical current comprises a semiconductor device and at least one electrical conductor for providing electrical power to and from the switch. At least one electrical conductor serves as a heat sink for extracting heat from the switch.

In another aspect of the present invention an electrical switch module comprises at least two switches, each of which comprise a semiconductor die and a sealed shell enclosing the die and at least one electrical conductor for providing electrical power to the module. At least one electrical conductor is a heat sink for extracting heat from the dies.

In still another aspect of the present invention a method for cooling a switching electrical power supply comprises the steps of providing electrical power to a switch on a first conductor, extracting heat from the switch on the first conductor and employing the first conductor as a heat sink to dissipate the heat extracted by the first conductor.

These and other features, aspects and advantages of the present invention will become better understood with reference to the following drawings, description and claims.

The accompanying figures are simplified and not drawn to scale. In the figures, each identical or substantially similar component that is illustrated in various figures may be represented by a single item or notation. For purposes of clarity, not every component is labeled in every figure. Nor is every component of each embodiment of the invention shown where illustration is not necessary to allow those of ordinary skill in the art to understand the invention.

DETAILED DESCRIPTION OF THE INVENTION

The following detailed description is of the best currently contemplated modes of carrying out the invention. The description is not to be taken in a limiting sense, but is made merely for the purpose of illustrating the general principles of the invention, since the scope of the invention is best defined by the appended claims.

Broadly, the present invention may be useful in electrical control systems which provide power sequencing and/or control for flow of power through solid-state switches. More particularly, the present invention may provide improved reliability for high power, high efficiency solid-state switches that may be operated at high frequencies. The present invention may be useful in land/air/sea traction applications and particularly aerospace applications which may require sealed solid-state switches for primary and secondary power devices and electric motor control systems for more electric aircraft (MEA). In such controlled electric power systems the present invention may provide for reliable, efficient and effective cooling of the switches.

In contrast to prior-art power control systems, among other things, the present invention may provide simultaneous cooling of multiple surfaces of a semiconductor die of a switch. The present invention, instead of wire-bonded construction, may employ a connection system in which electrical contact elements also perform a thermal conduction role for cooling. A switch package design may be constructed without external gating/PHM pins and may thus provide a reliable sealed switch at low cost.

Figure 1:
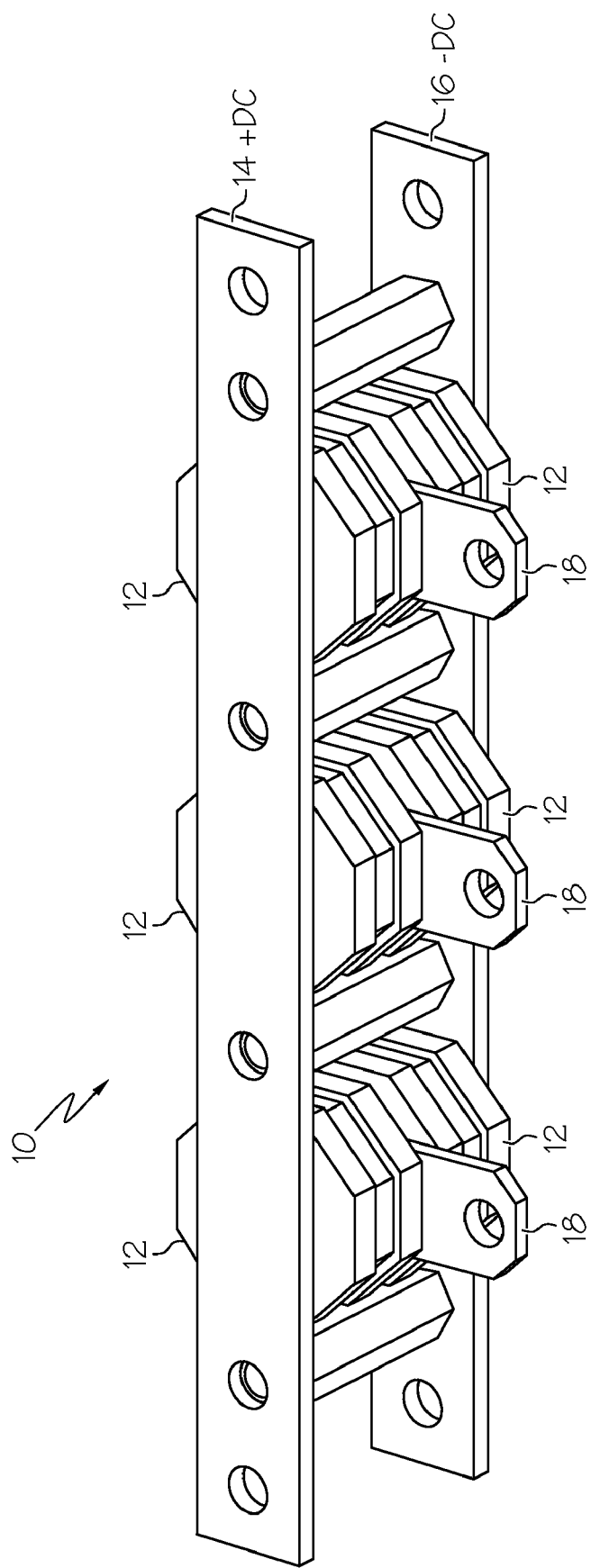
FIG. 1 is a perspective view of a switch assembly in accordance with the invention.

Referring now to FIG. 1, an illustrative embodiment of the present invention comprises a switch assembly 10 that may be configured to perform a direct current (DC) to alternating current (AC) conversion. In that regard the illustrative assembly 10 may be referred to as a converter 10 which is capable of operation as a rectifier for AC-DC or inverter for DC-AC power conversion. The converter 10 may comprise solid-state switches 12, a positive DC bus 14, a negative DC bus 16 and phase conductors 18. Each of the switches 12 may be in electrical and thermal contact with at least one of the DC buses 14 or 16 and one of the phase conductors 18.

In operation, the switches 12 may be controlled to electrically interconnect one of the DC buses 14 or 16 to one of the phase conductors 18. The switches may be operated at a predetermined frequency and sequence to provide three-phase AC power on the phase conductors 18. It may be noted that various configurations of the switches 12 may be assembled and employed in various well-known electrical applications such as, in primary and/or secondary solid-state power controllers (SSPC) for AC and DC applications replacing mechanical contactors or in aerospace More Electric Aircraft motor controls or general industry. In this regard, the switches 12 may be incorporated into assemblies that may require low frequency on-off command for control of flow of power for the first application and high-frequency and/or high power operation of the switches 12 for PWM control of the latter application.

The physical gating/control/PHM pins of the present invention can be eliminated and such signals may be communicated by high frequency transformer coupling (transfer of both power and gating/PHM signal as is known in the art) or RF transmission or PLC. Control signals could be in the form of sending speed, voltage, or current command as a reference value in a wireless mode to be further processed internally by an embedded central controller doing PWM/PHM control of one or more integrated package as described in this invention. As per below references, those skilled in the art appreciate how wireless communication/transfer of command and control signals can be used for on-off gating control of SSPCs or PWM gating/PHM of controlled devices of a power electronic equipment. As can be seen from below technical literature, transfer of gating/control/PHM information from a controller to a controlled device (or plurality of devices integrated in one packages) or vice versa can be easily implemented and will not be further discussed here. The following references are herein incorporated by reference in their entirety: S. K. Mazumder, M. Tahir, S. L. Kamisetty, "Wireless PWM control of a parallel dc-dc buck converter", provisionally accepted, *IEEE Transactions on Power Electronics*, 2004. S. K. Mazumder, K. Acharya, and M. Tahir, "Wireless control of spatially distributed power electronics," in *Proc. 20th Annu. IEEE Applied Power Electronics Conf. Expo*, vol. 1, March 2005, pp. 75-81. M. Tahir, S. K. Mazumder, "Markov-chain-model-based Performance Analysis of Transmitter Power Control in Wireless MAC Protocol: Towards Delay Minimization in Power-network Control," Accepted: Proceedings of IEEE International Conference on Advanced Information Networking and Applications, 2007. M. Tahir, S. K. Mazumder, "Improving Throughput-delay Performance by Merged Packet Routing in Wirelessly Controlled Interactive Power Networks," Accepted: Proceedings of IEEE International Conference on Advanced Information Networking and Applications, 2007. "HomePlug AV White Paper", Document version number: HPAVWP-050818, Homeplug Powerline Alliance, Inc., 2005. Ahola, Jero, "Applicability of Power-Line Communications to Data Transfer of On-line Condition Monitoring of Electrical Drives", Thesis for the degree of Doctor of Science, Lappeenranta University of Technology, 2003

Figure 2A:
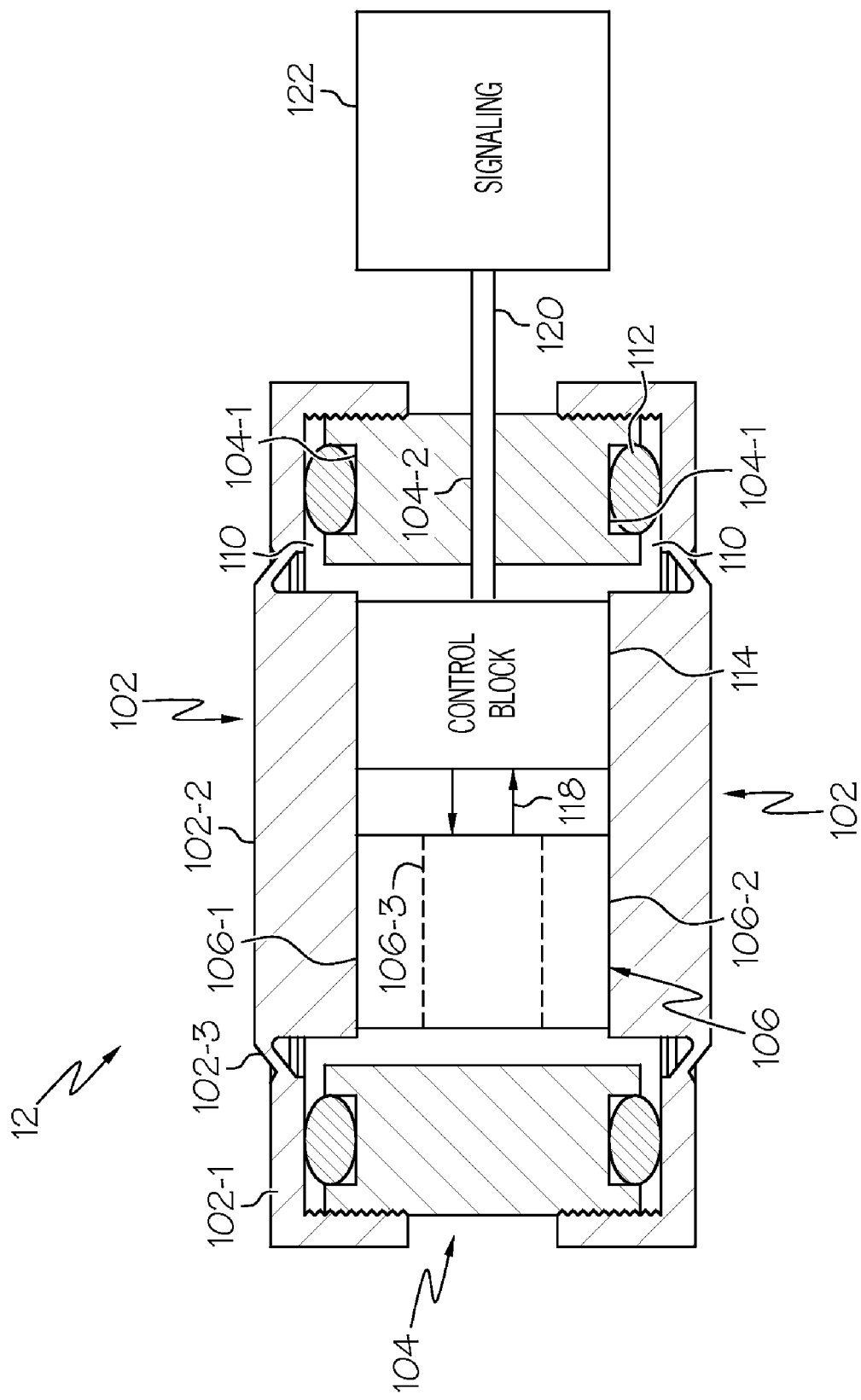
FIG. 2A is a schematic cross-sectional view of a switch in accordance with the invention.

Referring now to FIG. 2A, an illustrative embodiment of one of the switches 12 is shown in accordance with the present invention. The switch 12 may be comprised of electrically conductive contact caps 102. The contact caps 102 may be jar-type contact caps, wherein a lid can be tightened by rotation of the lid on a threaded shell. Alternatively, the contact caps 102 may be plate-like lids on each side of the switch 12 fastened by screws onto the upper and lower surface of the shell. The contact caps 102 may be threaded and screwed on a threaded shell 104 which may be comprised of an electrically non-conductive material such as plastic or ceramic. The contact caps 102 may be in contact with a semiconductor die 106 such as an IGBT or MOSFET through solder bumps or other methods known in prior art (e.g., conducting vertical springs). In FIG. 2, for purposes of simplicity, the die 106 is illustrated symbolically as a single device. The die 106 is shown with a collector or source region 106-1 in contact with a first one of the contact caps 102 and with an emitter or drain region 106-2 in contact with a second one of the contact caps 102. A gate region 106-3 may be interposed between the regions 106-1 and 106-2 and the gate region 106-3 may be electrically isolated from the contact caps 102.

It may be noted that many types of devices may be configured in accordance with the present invention. For example, one or more of the switches may comprise a Si or SiC diode, a symmetrical blocking thyristor, an asymmetrical thyristor or a gate turn-off device (GTO). Additionally, it may be noted that the switch 12 may be constructed with a plurality of the dies 106 connected together electrically in parallel. For example, the switches may comprise a plurality of MOSFETs connected together in parallel by being in contact with the contact caps 102 In such an arrangement, the switch 12 may provide power capacity that may be associated with multiple MOSFETs without a need to provide prior-art wire-bond connections between the multiple MOSFETs. Elimination of prior-art wire bonds improves reliability, provides a MOSFET, or other semiconductor device, based switch with particularly low resistive losses and may significantly reduce stray inductances within the device package.

Figure 2C:
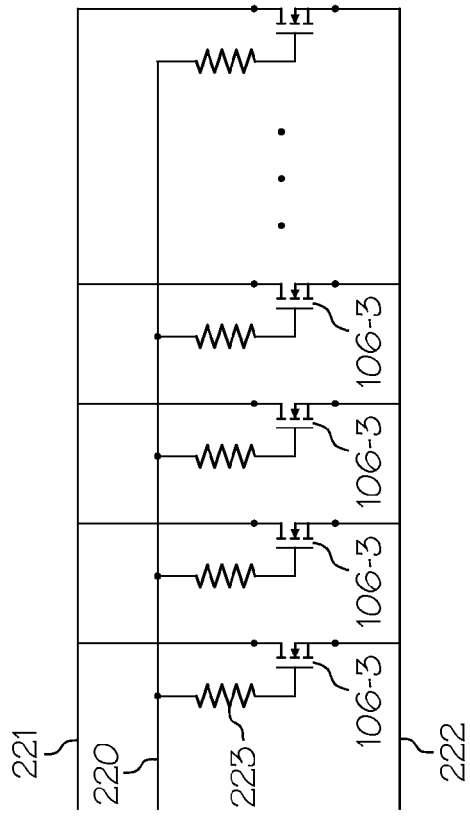
FIG. 2C is an electrical schematic diagram of the embodiment of the switch of FIG. 2A.
Figure 2D:
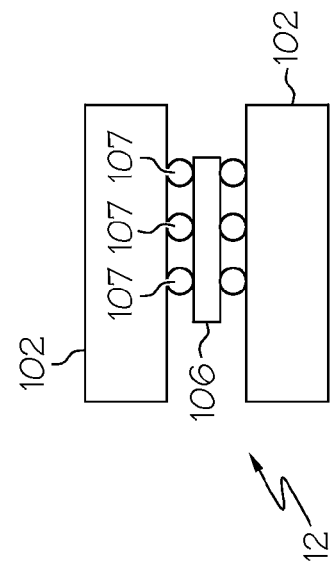
FIG. 2D is a schematic cross-sectional view of the switch of FIG. 2 showing a contact enhancement system in accordance with the invention.
Figure 2B:
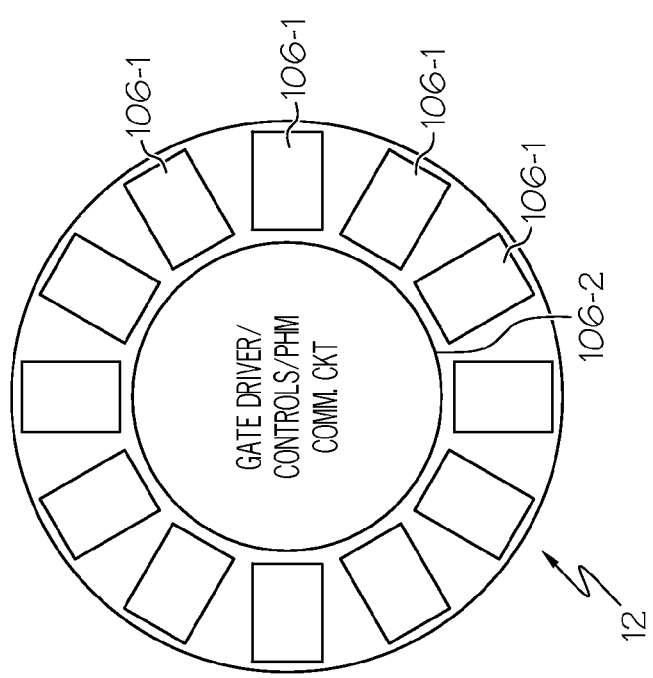
FIG. 2B is a simplified schematic plan view of an embodiment of the switch of FIG. 2A in accordance with the invention.

Referring now to FIGS. 2B and 2C, in an illustrative embodiment, a plurality of devices such as MOSFETs 106 may be arranged around a gate driver area 106-2 in the switch 12. FIG. 2C presents an electrically equivalent schematic of the arrangement of the MOSFETs 106 of FIG. 2B Referring back now to FIG. 2A, the contact caps 102 may comprise an internally threaded retention portion 102-1 and a contact portion 102-2. The contact portion 102-2 may be connected to the retention portion 102-1 with a flexible connection portion 102-3. The contact cap 102 is illustratively shown in FIG. 2 as an integral structure that may be formed from a single piece of material. In this illustrative integral configuration, the connection portion 102-3 may comprise a portion of the material with a reduced thickness. It may be noted that, within the scope of the present invention, the contact cap 102 may be constructed from multiple elements of material attached together by conventional brazing or welding.

As the contact cap 102 is assembled onto the shell 104, the contact portion 102-2 may engage with the die 106 before the retention portion 102-1 reaches a limiting position on the shell 104. In other words, the contact portion 102-2 may engage with the die 106 while there is still a space 110 between the retention portion 102-1 and the shell 104. The retention portion 102-1 may be further threadably advanced onto the shell 104 after the contact portion 102-2 is engaged with the die 106. Such further advancement of the retention portion 102-1 may result in a relative displacement between the contact portion 102-2 and the retention portion 102-1. This may result in a flexure of the flexible portion 102-3 with a resultant compressive force between the die 106 and the contact portion 102-2.

Referring now to FIG. 2D, a schematic illustrative embodiment of a contact enhancement system is shown. Compressible metal elements such as solder bumps 107 may be interposed between the die 106 and the contact caps 102 to assure sound electrical contact. The solder bumps 107 may be compressed when the contact caps 102 are pressed onto the die 106. In a case of multiple dies such as the MOSFETs 106-1 of FIG. 2D, the solder bumps 107 may provide accommodation for varying thicknesses of the MOSFETs 106-1. In an illustrative embodiment, the solder bumps 107 may be printed on surfaces of the dies or the contact caps 102 with methods such as silk-screen printing.

In a simplified conceptual electrical diagram FIG. 2C, it may be seen that a common gate signal 220 may control simultaneous turn-on and turn-off of all the parallel MOSFETs 106-1. The gate signal may be brought to the controlled MOSFETs 106-1 through a) traditional physical gating pins (not shown); or b) through Power Line Carrier (PLC) in which "on" and "off" signal patterns are modulated on a high frequency low voltage signal and superimposed on the power input and output lines (in this case, drain line 221 and source line 222) and demodulated internally through conventional prior art PLC methods to obtain a desired gating pattern; or c) through fiber optics lines; or, d) through use of wireless technology in which one or more remote master transmitter(Tx)/receiver(Rx) modules may send encrypted control signal and receive PHM data from one or more controlled systems through a defined communication protocol established for seamless operation of all controlled nodes with minimal delay. At each distributed controlled node (e.g., one of the MOSFETs 106-1 shown in FIG. 2B) the gate driver in case d) may include Rx & Tx and de-encryption to extract the sent command/control data and transfer the gating signals 220 to the gates 106-3 through gate resistor 223.

Sealing members 112 may be positioned in channels 104-1 formed in the shell 104. As the retention portions 102-1 are advanced into position on the shell 104, the sealing members 112 may be compressed to form a seal for the switch 12. The sealing member 112 may comprise an O-ring.

It may be noted that in an alternative embodiment, the contact caps may be secured with screws.

Referring to FIGS. 2A-2E, the switch 12 may comprise a control block 114 that may provide various controlling functions for the die 106. For example, the control block 114 may include circuitry that performs various functions such as gate driver functions, protection and prognostics health monitoring (PHM) functions, isolated self-powered internal positive voltage (e.g., +15V) power supply for turn-on and negative supply (e.g., −5V) for keeping the device in the off-position. Furthermore, passive or active snubbers can be internally included in the device to alleviate stress on the switching device, as required. The concept, as is known in the art, of passing power and signal (both gating and PHM) can be used in this invention. Self-powered power supply can be obtained by using an isolated converter which takes power from the voltage across the device when it is in off position, or reuse some the energy recovered during commutation and stored for internal use. Detailed implementation of these concepts is well understood to those skilled in the art and will not be covered here. This novel inclusion of the control block 114 within the shell 104 of the switch 12 may provide numerous advantages.

The control block 114 may be positioned close to the die 106. Consequently interconnections 118 between the control block 114 and the die 106 may produce only minimal losses and time delays. For example a snubber may be incorporated within the control block 114 and may provide for re-generation of energy during operation of the switch 12. Interconnections 118 between the control block 114 and the die 106 may be made internally within the sealed switch 12. Internalization of the interconnections 118 may allow for elimination of external connection pins which may otherwise be required for operation of prior-art switches.

While internalization of the interconnections 118 is generally desirable, there are some disadvantages to such internalization. Inclusion of the control block 114 in the switch 12 may result in a lower manufacturing yield for the switches 12. The control block 114 may comprise numerous interacting devices and connections which may be subject to failure during manufacturing. If the switch 12 were produced with conventional prior-art "press-pack" techniques, reduced yields resulting from internalization of the control block 114 may be intolerable. In another embodiment of the present invention, the contact caps 102 are removable. Because of this novel feature, one of the switches 12 may be opened for repair in the event that a manufacturing defect arises. Performing a repair may preclude a need to discard an assembly of expensive components because of a failure of only one of the internal components, a failure of a connection or any other internal failure or defect.

In the embodiment of the present invention shown in FIG. 2A, a signal input member 120 may be provided to interconnect a signaling block 122 with the control block 114. The signal input member may pass through the shell 104 in a sealed passageway 104-2. The switch 12 shown in FIG. 2 may provide a cost-effective sealed/air-tight press-pack-style package. One of the main advantages of this type of package is the fact that many such switches can be put in series/parallel connection because of the ease with which they can be connected electrically and mechanically in an assembly. In addition, in a failed state, where one of the switches 12 may fail short, it may be possible to ensure overall combined functionality by putting more of the switches 12 in series. When one switches 12 fails, it may go short. Thus by employing two or more levels of redundancy, even if one or two switches 12 fail, voltage blocking capability may be guaranteed by the incorporated level of redundancy. Dynamic and static voltage sharing may be provided with a combination of Resistors and/or RC snubbers placed across each series switch.

Figure 2E:
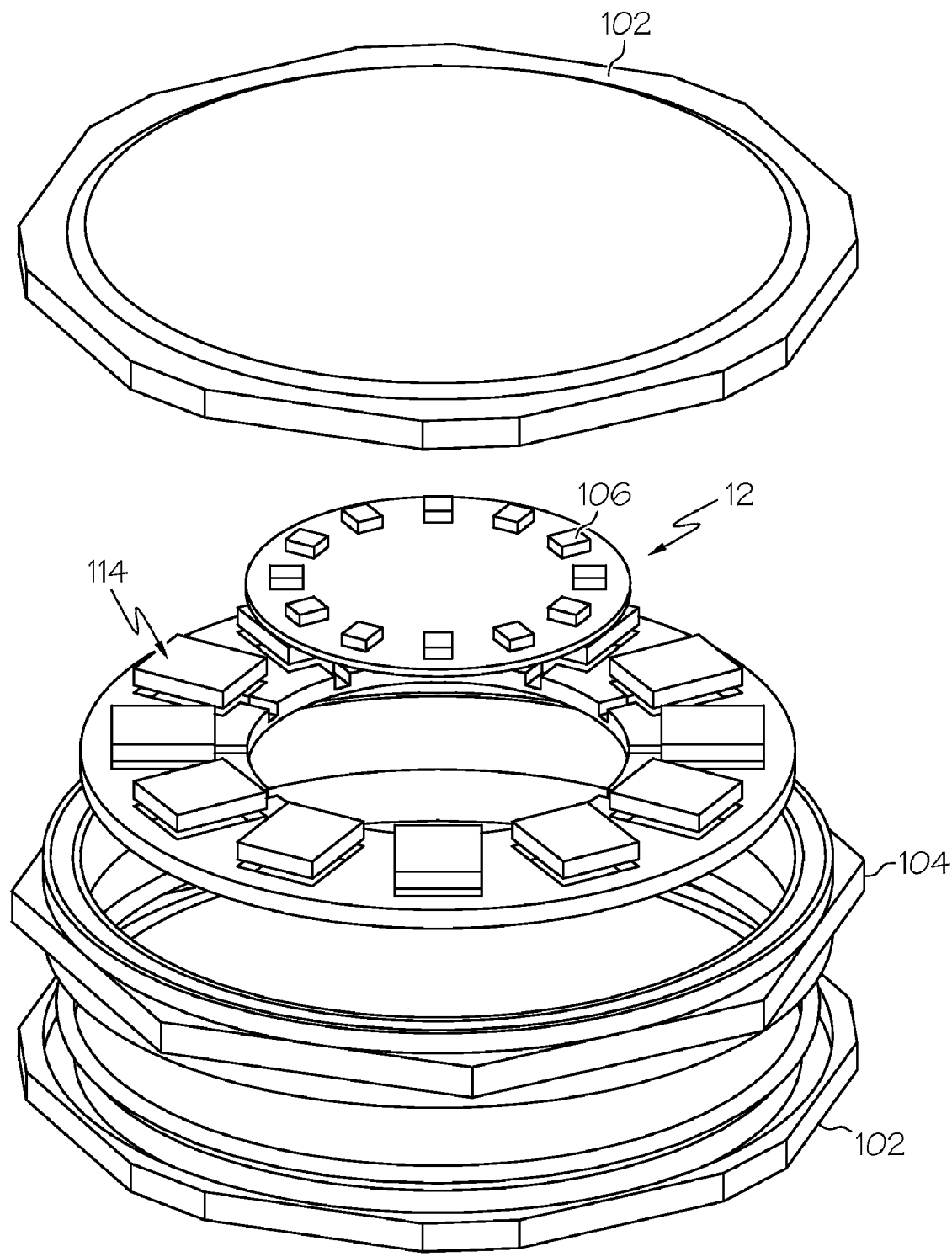
FIG. 2E is an exploded view of the switch assembly in accordance with one embodiment of the present invention.

Referring specifically to FIG. 2E, the shell 104 and caps 102 may create a cavity 104a reserved for placing semiconductors, such as dies 106, in direct contact with the caps 102. The present invention may provide the concept of double-sided cooling with one integrated path on each side for both electrical conduction and thermal management.

Figure 3:
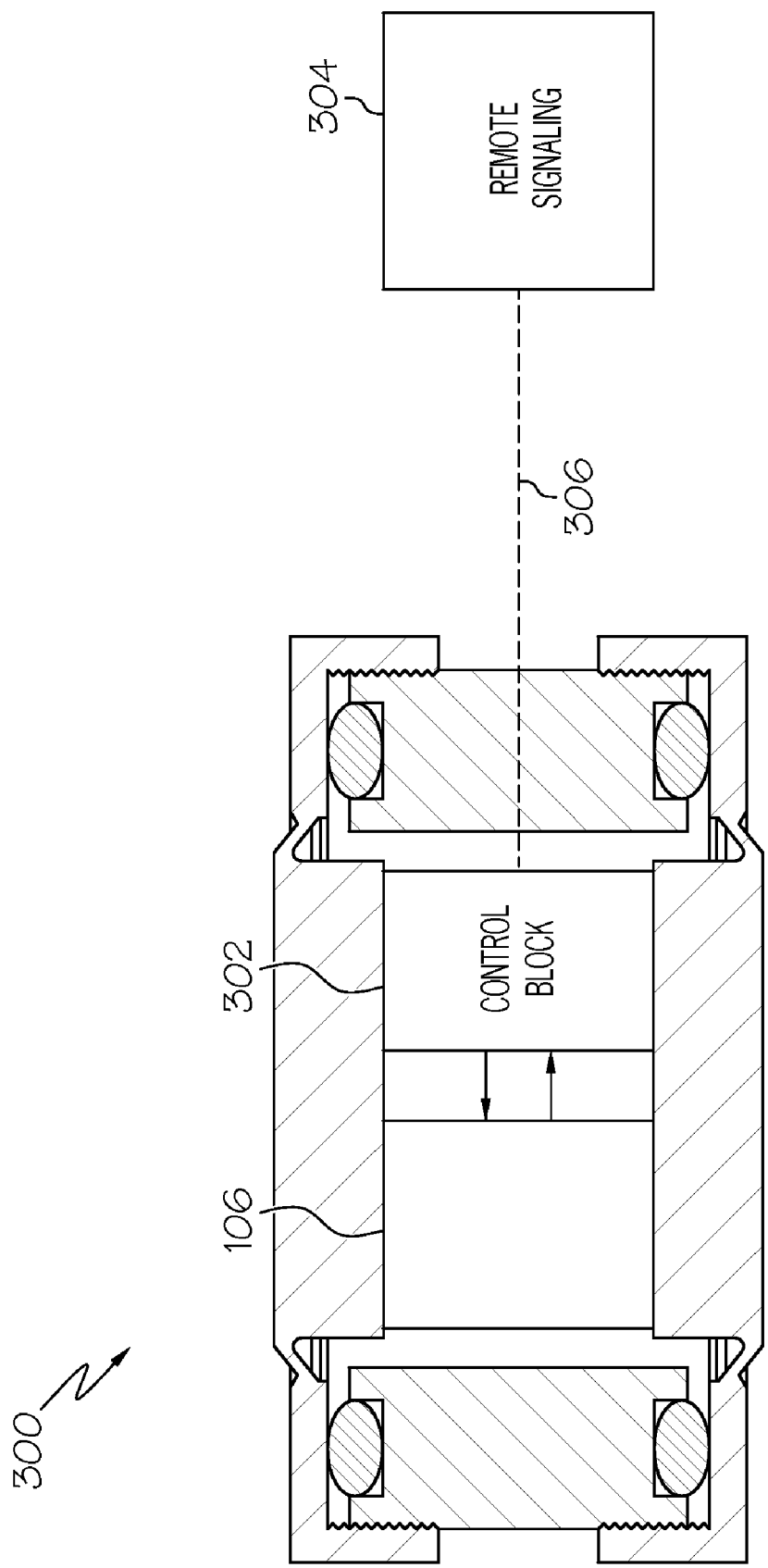
FIG. 3 is a schematic cross-sectional view of another embodiment of a switch in accordance with the present invention.

In another embodiment of the present invention shown in FIG. 3, a switch 300 may comprise a control block 302 which may be provided with remote signaling. A remote signaling block 304 may produce signals 306 which may be transmitted remotely or wirelessly to the control block 302. For example, the signals 306 may be transmitted as radio frequency (RF) signals (e.g. with transmitters/Receivers on the sending end and receiving end, as described above) or as power line carrier signals (e.g., through use of power lines for carrying modulated high frequency information as described above).

Figure 4:
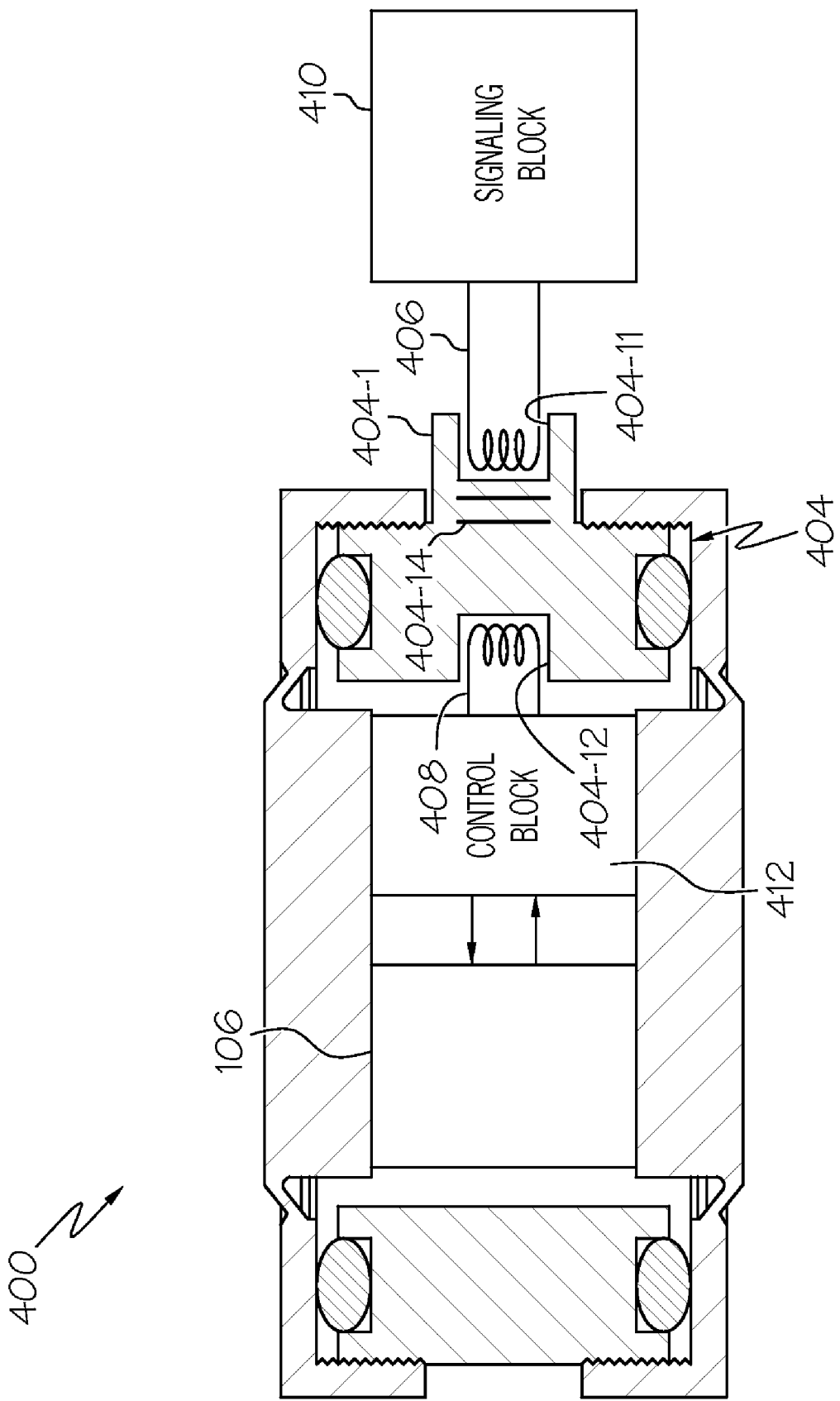
FIG. 4 is a partial schematic cross-sectional view of a portion of another embodiment of a switch in accordance with the invention.

In another embodiment of the present invention, signals may be provided to a switch 400 through transformer coupling, as is known in the art. FIG. 4 shows a configuration of a shell 404 of the switch 400. The shell 404 may be provided with a transformer adapter 404-1. The adapter 404-1 may comprise a slot 404-11 for a transformer primary winding 406 and a slot 404-13 for a transformer secondary winding 408. A transformer core 404-14 may be incorporated into the transformer adapter 404-1. Signaling produced in a signaling block 410 may be transmitted a control block 412 through the transformer windings 406 and 408.

It may be seen that the embodiment of the invention shown in FIGS. 3 and 4 may be operated without external connection pins. Reliable sealing may be readily achieved when there are no external-connection penetrations through the shell 104 or 404.

Referring back now to FIGS. 1 and 2, it may be seen how the inventive configuration of the switch 12 may be effectively cooled during its operation. The switches 12 may be positioned so that their respective contact caps 102 may be in contact with one of the DC buses 14 or 16 or one of the phase conductors 18. The DC buses 14 and 16 and the phase conductors 18 may be constructed from material that is both electrically and thermally conductive (i.e., integrated thermal management may be included into conducting bus-bars). Furthermore, the buses 14 and 16 and the conductors 18 may be constructed from heavy gauge materials with a large thermal mass. Indeed the buses 14 and 16 may be hollow so that cooling fluid may be circulated through the buses. Thus the buses 14 and 16 and the conductors 18 may function in a dual role within the switch assembly 10. They may perform an electrical conduction role and in addition, they may perform a thermal conduction role and a heat dissipation role as heat sinks.

Heat may be transferred from the die 106 from both the collector region 106-1 and the emitter region 106-2 (IGBT example, also applicable to other types of devices). As a consequence, heat generated within the die 106 may be readily transferred out of the die 106 across two of its surfaces thereby reducing a potential for formation of thermal gradients within the die 106. Furthermore, because the switch 12 may be sealed, the switch assembly 10 may be immersed in a liquid coolant in order to further enhance cooling.

Figure 5:
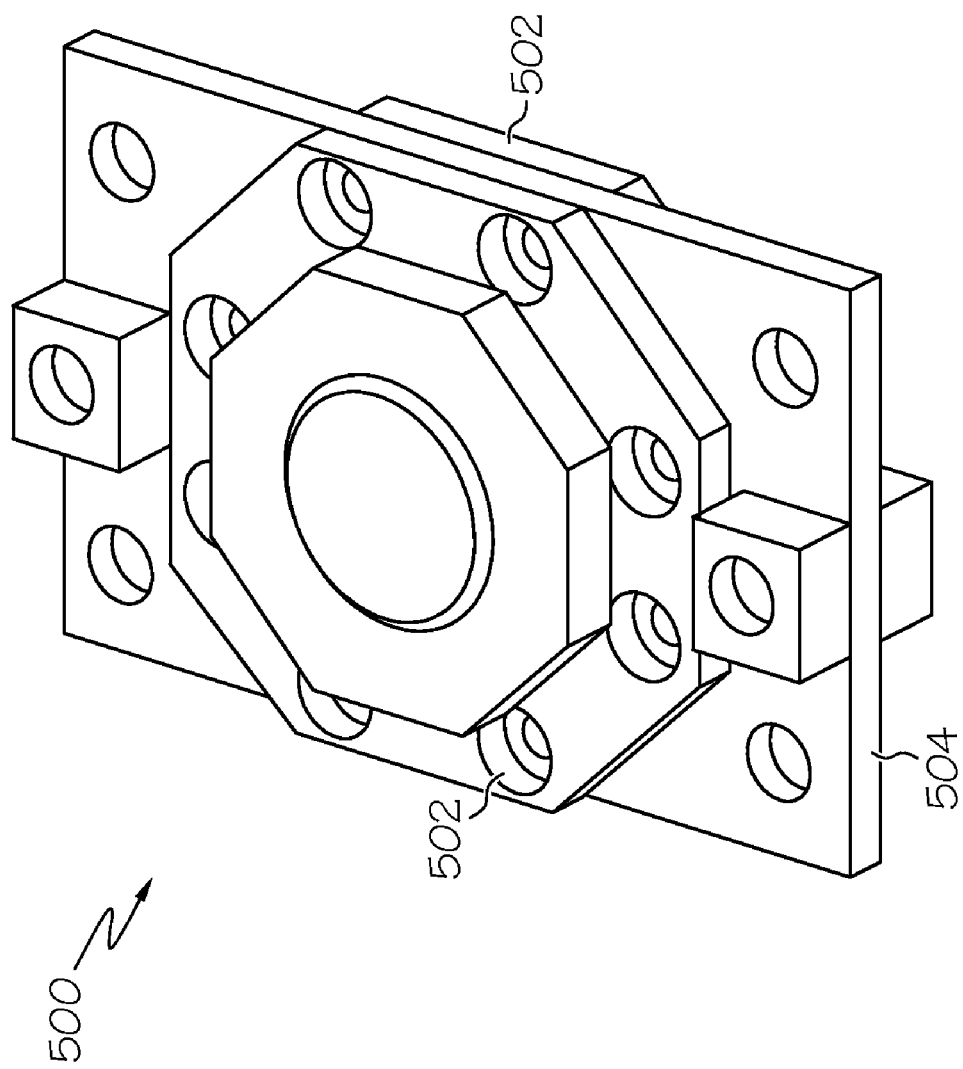
FIG. 5 is a perspective view of a switch module in accordance with the invention.
Figure 6A:
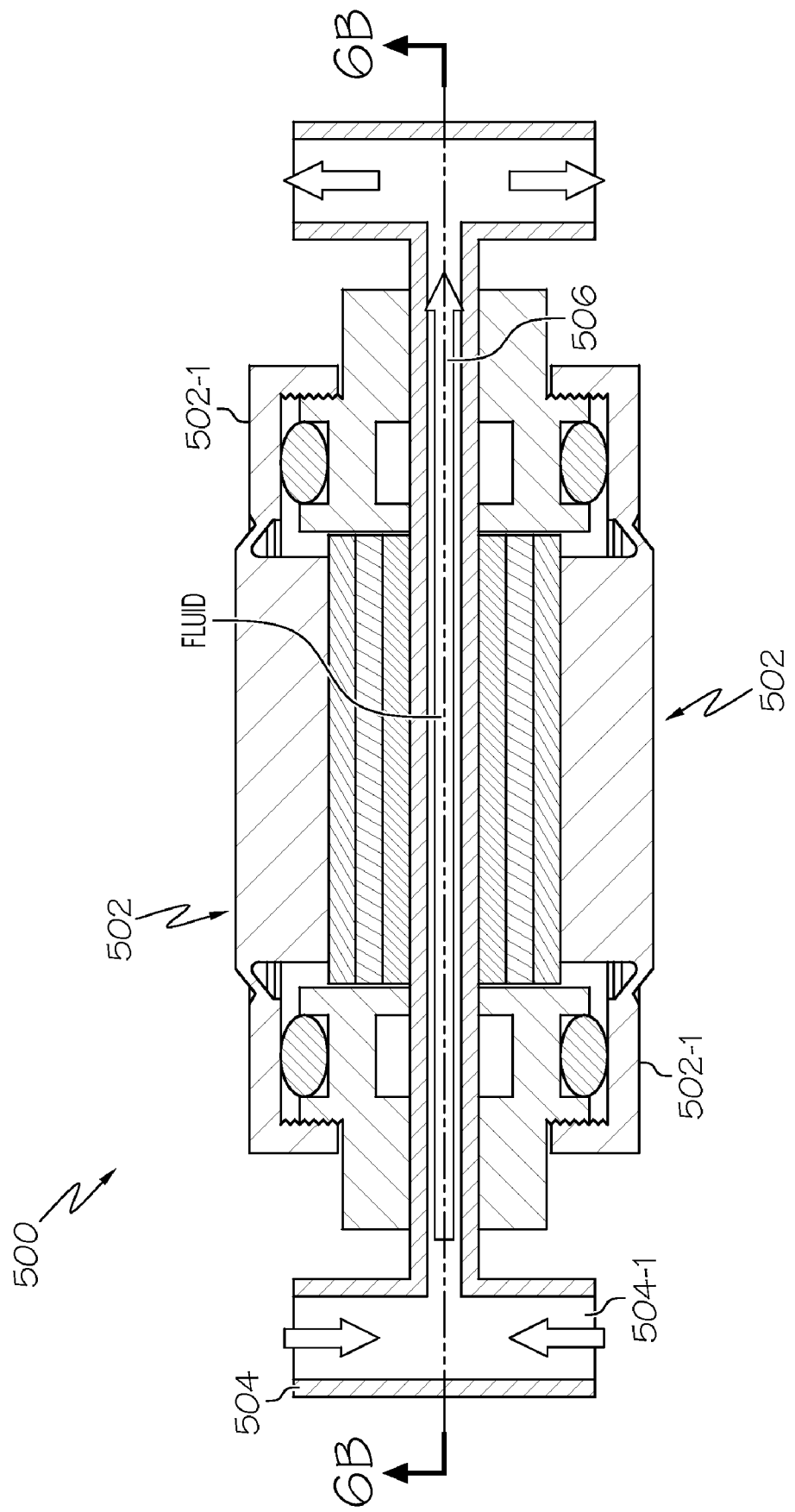
FIG. 6 is cross sectional view of the switch module of FIG. 5 in accordance with the invention.
Figure 6B:
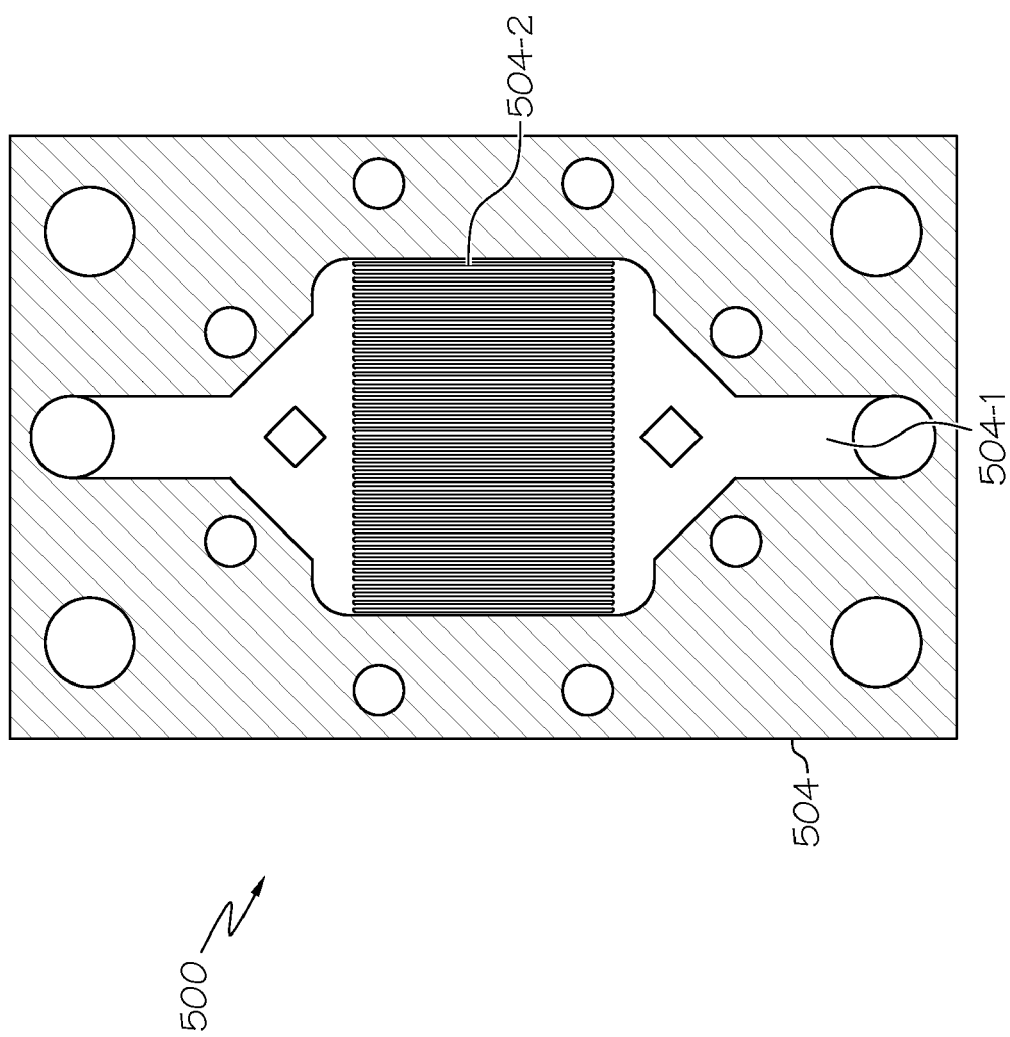

Referring now to FIGS. 5 and 6A and 6B, it may be seen how switches may be assembled into a module 500 with internal cooling. Two switches 502 may be assembled back-to-back on a fluid-cooled electrical conductor 504. The switches may be similar in construction to the switches 12 except that the switches 502 may be provided with only one contact cap 502-1. The switches 502 may be positioned in contact with the fluid-cooled conductor 504. The fluid-cooled conductor may be provided with a fluid passage 504-1 through which cooling fluid 506 may flow. In a cross-sectional FIG. 6B, it may be seen that heat sink fins 504-2 may be incorporated into the fluid-cooled electrical conductor 504.

Figure 7:
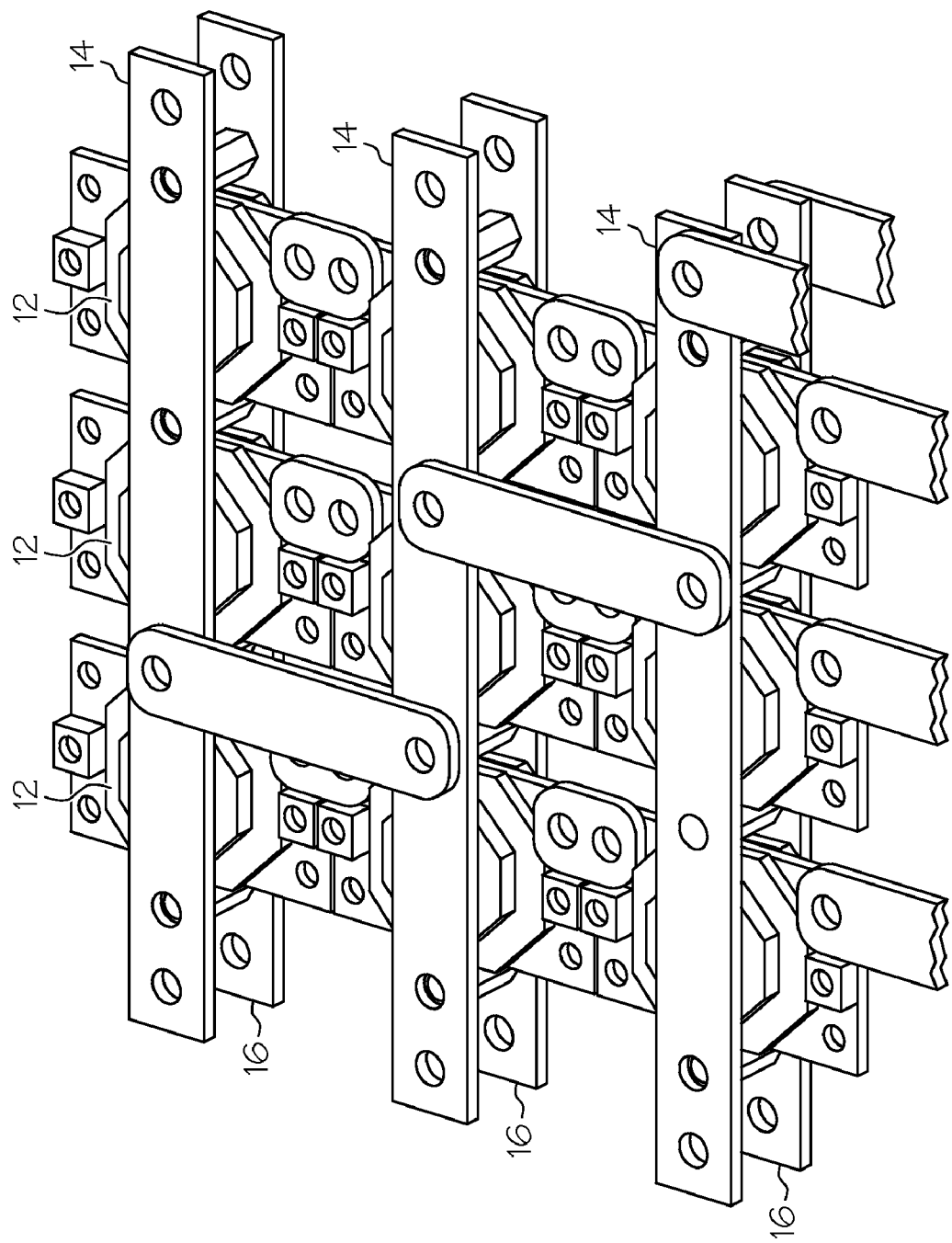
FIG. 7 is an example of an array configuration of the switches of FIG. 2 in accordance with the present invention.

Referring now to FIG. 7, it may be seen the inventive switches 12 and their various embodiments may be combined in a modular array. FIG. 7 illustrates but one example of an array that may be achieved with the inventive modular switches 12. As can be appreciated by one skilled in the present art, many possible arrays of parallel and series combinations may be produced.

Figure 8:
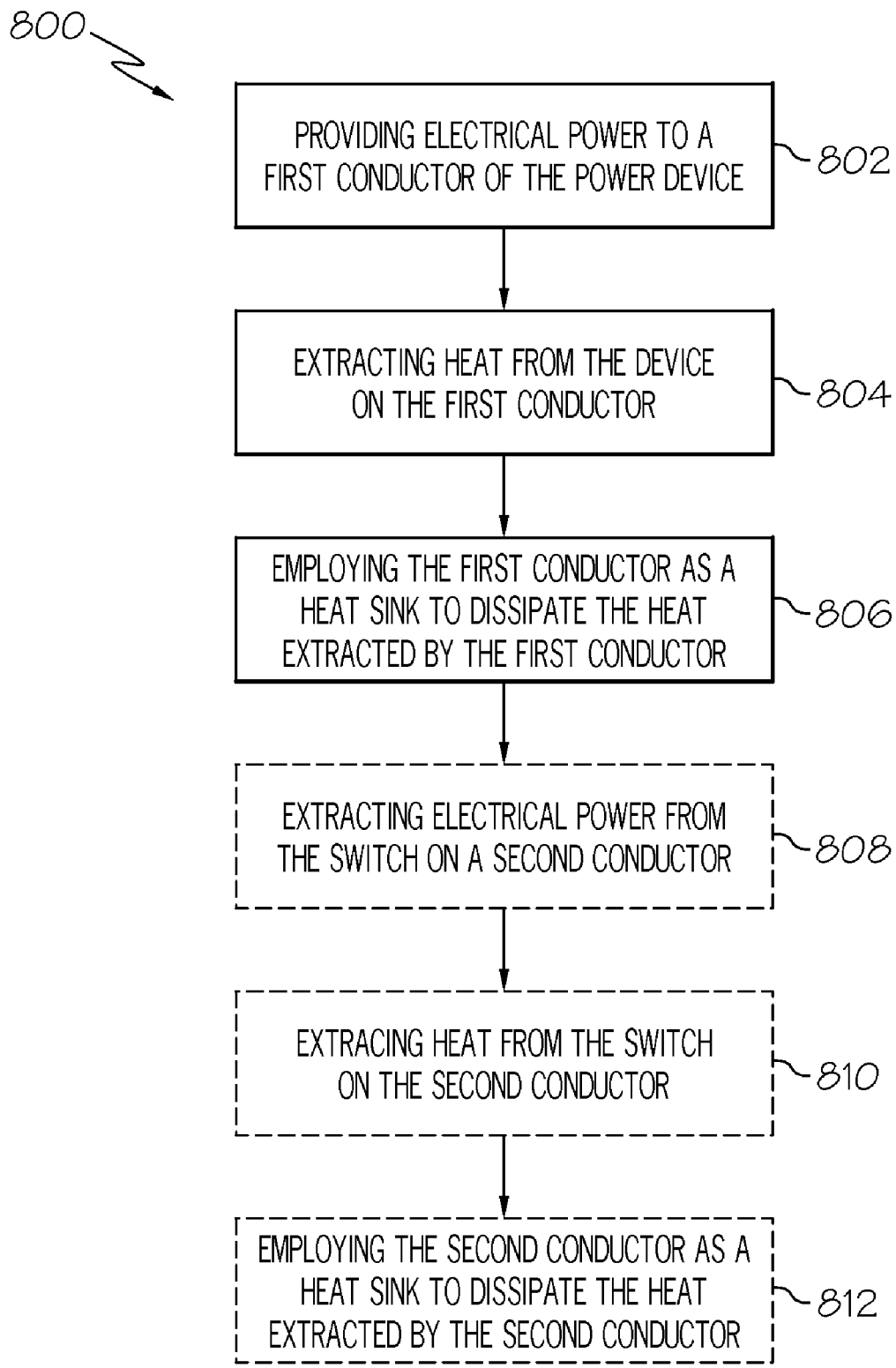
FIG. 8 is a flow chart of a method for performing switching in accordance with the present invention.

In one embodiment of the present invention, a method is provided for operating and cooling a solid-state switch. In that regard the method may be understood by referring to FIG. 8. In FIG. 8, a flow chart portrays various aspects of an inventive method 800. In a step 802, electrical power may be provided to one side of a switch (e.g. power from the bus 14 may be provided the contact cap 102 of the switch 12). In a step 804, a gating signal may be produced remotely from the switch (e.g., the signaling block 122, 304 or 410 may produce a command signal for the control block 114, 302 or 412 respectively). In a step 806, the switch may be operated with internal gating control (e.g., the gating region 106-3 of the die 106 may be driven by the control block 114 which is internal to the switch 12).

In a step 808, electrical power may be extracted from a second side of the switch (e.g., electrical power from one of the contact caps 102 may be extracted by one of the phase buses 18). In a step 810, heat may be extracted from the first side of the switch (e.g., the DC bus 14 may extract heat through one of the contacts caps 102). In a step 812, heat may be extracted from the second side of the switch (e.g., the phase conductor 18 may extract heat through one of the contacts caps 102). In a step 814, electrical power may be delivered and cooling may be performed on the same conductors (e.g., the phase conductors 18 may perform power delivery and cooling functions).

It should be understood, of course, that the foregoing relates to exemplary embodiments of the invention and that modifications may be made without departing from the spirit and scope of the invention as set forth in the following claims.

We claim:

1. An apparatus for switching electrical power comprising:
a semiconductor device;
a shell surrounding the semiconductor device;
a compressible sealing member positioned at a first end of the shell;
a first removable end cap having a contact portion adapted to directly electrically connect to the semiconductor device, a retention portion adapted to removably mechanically interconnect to the first end of the shell and a flexible portion interposed between the contact portion and the retention portion; and
a first electrical conductor for providing electrical power to the apparatus,
wherein the first electrical conductor is also a heat sink for extracting heat from the apparatus and
wherein the first removable end cap is configured to allow the retention portion to be displaced axially relative to the contact portion, with flexure of the flexible portion, to compress the sealing member when the contact portion is engaged with the semiconductor device.

2. The apparatus of claim 1 further comprising:
a second removable end cap having a contact portion adapted to directly electrically connect to the semiconductor device and a retention portion adapted to removably connect to a second end of the shell; and
a second electrical conductor for extracting electrical power from the apparatus,
wherein the second electrical conductor is also a heat sink for extracting heat from the apparatus.

3. The apparatus of claim 2 wherein:
the semiconductor device comprises a semiconductor die having first and second surface areas;
the first removable end cap is in contact with the first surface area of the die;
the second removable end cap is in contact with the second surface area of the die;
the first removable end cap is in thermal and electrical contact with the first conductor; and
the second removable end cap is in thermal and electrical contact with the second conductor.

4. The apparatus of claim 1 wherein:
the semiconductor device comprises a gate driver for the die positioned within the shell; and
the gate driver is adapted to receive command signals from outside of the shell.

5. The apparatus of claim 4 wherein:
the shell is sealed; and
the command signals are transmitted to the gate driver without external pin penetration through the shell.

6. The apparatus of claim 5 wherein:
the command signals are provided through a transformer;
a primary transformer winding is outside the shell; and
a secondary transformer winding is inside the shell.

7. The apparatus of claim 6, further comprising a control block inside the shell.

8. An apparatus for switching electrical power comprising:
a plurality of semiconductor devices arranged in a first ring;
a shell surrounding the ring of semiconductor devices;
a first removable end cap having a contact portion adapted to directly electrically connect to the semiconductor devices and having a retention portion adapted to removably mechanically interconnect to a first end of the shell;
a plurality of gate drivers positioned in a second ring surrounding the first ring within the shell adjacent to the semiconductor devices, wherein the gate drivers are adapted to receive command signals from outside of the shell; and
at least one electrical conductor disposed for conducting electrical power to the switch,
wherein the at least one electrical conductor is also a heat sink for extracting heat from the switch.

9. The apparatus of claim 8 further comprising:
a second removable end cap adapted to electrically connect with the semiconductor devices; and
a second electrical conductor disposed for extracting electrical power from the apparatus,
wherein the second electrical conductor is also a heat sink for extracting heat from the apparatus.

10. The apparatus of claim 9 wherein:
one or more of the semiconductor devices comprises a semiconductor die having first and second surface areas;
the first removable end cap is in contact with the first surface area of the die;
the second removable end cap is in contact with the second surface area of the die,
the first removable end cap is in thermal and electrical contact with at least one conductor; and
the second removable end cap is in thermal and electrical contact with the second conductor.

* * * * *